(12) United States Patent
Ayotte et al.

(10) Patent No.: US 7,915,732 B2
(45) Date of Patent: Mar. 29, 2011

(54) PRODUCTION OF INTEGRATED CIRCUIT CHIP PACKAGES PROHIBITING FORMATION OF MICRO SOLDER BALLS

(75) Inventors: Stephen P. Ayotte, Bristol, VT (US); Jeffrey D. Gilbert, Fairfax, VT (US); David J. Hill, Richmond, VT (US); Ronald L. Mendelson, Richmond, VT (US); Timothy M. Sullivan, Essex, VT (US)

(73) Assignee: International Business Mahines Corporation, Armonk, NY (US)

( * ) Notice: Subject to any disclaimer, the term of this patent is extended or adjusted under 35 U.S.C. 154(b) by 0 days.

(21) Appl. No.: 12/164,447

(22) Filed: Jun. 30, 2008

(65) Prior Publication Data

US 2009/0321914 A1   Dec. 31, 2009

(51) Int. Cl.
*H01L 23/48*   (2006.01)
*H01L 23/52*   (2006.01)
*H01L 29/40*   (2006.01)

(52) U.S. Cl. ......... 257/738; 257/778; 257/779; 257/780
(58) Field of Classification Search .................. 257/738, 257/778–780
See application file for complete search history.

(56) References Cited

U.S. PATENT DOCUMENTS

| | | | |
|---|---|---|---|
| 6,238,948 B1 | 5/2001 | Ramalingam | |
| 6,528,345 B1 | 3/2003 | Cook | |
| 2007/0026575 A1* | 2/2007 | Subramanian et al. | 438/127 |

* cited by examiner

*Primary Examiner* — Thien F Tran
(74) *Attorney, Agent, or Firm* — David A. Cain; Hoffman Warnick LLC

(57) ABSTRACT

Methods for making, and structures so made for producing integrated circuit (IC) chip packages without forming micro solder balls. In one embodiment, a method may include placing a solid grid made from an organic material between the IC chip and the substrate. The grid provides a physical barrier between each of a plurality of Controlled Collapse Chip Connections, and thereby prevents the formation of micro solder balls between them, thus improving chip performance and reliability.

4 Claims, 4 Drawing Sheets

PRODUCTION OF INTEGRATED CIRCUIT CHIP PACKAGES PROHIBITING FORMATION OF MICRO SOLDER BALLS

BACKGROUND

1. Technical Field

The disclosure relates generally to integrated circuit (IC) chip package processing, and more particularly to the production of IC chip packages using a solid grid to prevent the formation of micro solder balls.

2. Background Art

The production of integrated circuit (IC) chips including Controlled Collapse Chip Connections (C4s) is currently plagued by a yield loss problem caused by the formation of micro solder balls during chip join processes. These defects are caused by solder on the substrate being squeezed out from under a C4 to such extent that the solder on two adjacent pads touch each other. Surface tension between the solder C4s causes the solder to form into micro solder balls. The presence of micro solder balls has been shown to negatively impact shipped product quality level and field reliability of the IC chip packages containing them.

An additional challenge in IC chip package processing is C4 to C4 shorting, caused by the formation of defects known as geodes. Geodes are caused by the outgassing of organics in a C4, resulting in hollow C4s that grow in size to such an extent that they touch, and the gap between them is bridged, causing a short.

SUMMARY

A method and structure for producing an integrated circuit (IC) chip package without micro solder balls are presented.

In a first embodiment, an integrated circuit (IC) chip package is provided, the IC chip package comprising: a substrate; an IC chip including a plurality of controlled collapse chip connections (C4s); and a solid grid, the grid being between the substrate and the IC chip, wherein the grid provides a physical barrier between each of the plurality of C4s.

In a second embodiment, a method for making integrated circuit (IC) chip packages is provided, the method comprising: providing a substrate; providing an IC chip including a plurality of controlled collapse chip connections (C4s); providing a solid grid; placing the IC chip on the grid, the grid being between the substrate and the IC chip; and using a chip join process to process the IC chip package, wherein the grid forms a box around each of a plurality of chip join sites.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

The disclosure addresses a method and structure for making, and an integrated circuit (IC) chip package structure produced such that the creation of micro solder balls is prohibited, thus improving yield, shipped product quality levels, and field reliability.

Figure 1:
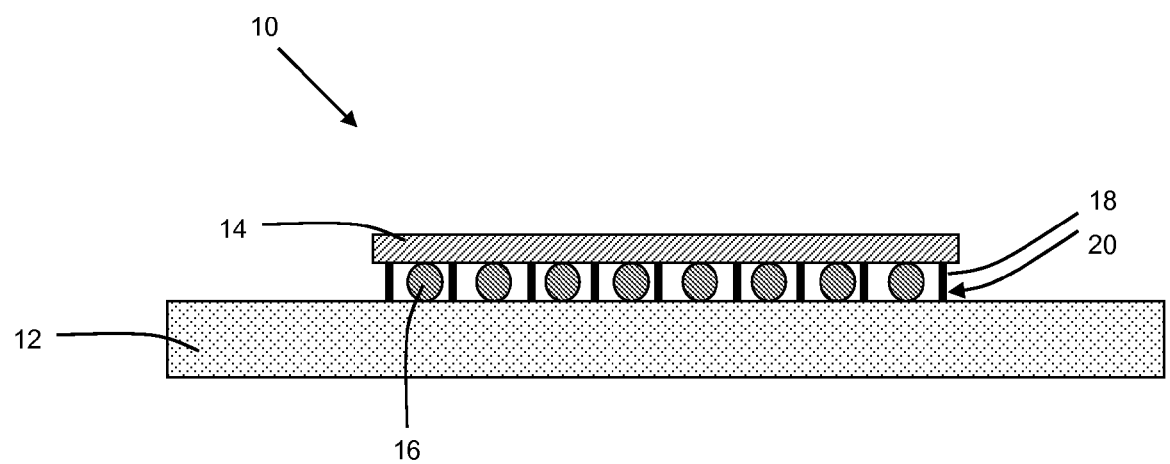
FIGS. 1-2 show an embodiment of a structure according to the disclosure.
Figure 2:
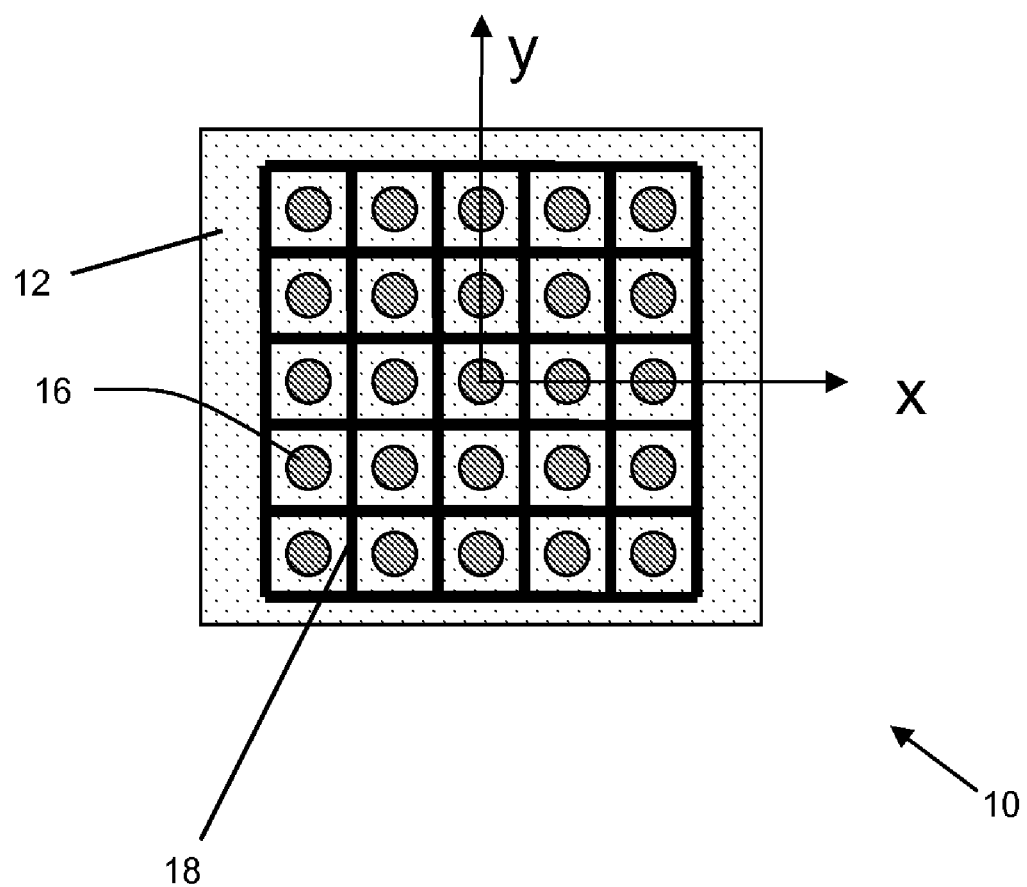

Referring to the drawings, FIGS. 1-2 show an embodiment of IC chip package 10 according to this disclosure. IC chip package 10 includes substrate 12, upon which subsequent layers, including IC chip 14, are built. IC chip 14 further includes controlled collapse chip connections (C4s) 16 and solid grid 18. Once the layers have been built, IC chip package 10 under goes a chip join process to assemble the layers into a finished package.

In the absence of grid 18, eutectic solder balls may be created during a first chip join reflow, causing either or both of bridging between C4s 16 and reduced spacing between C4 joints, ultimately resulting in decreased field reliability of chip 10. This often results from localized delayed wetting, off-center placement of C4s 16, or higher laminate pad eutectic solder volumes, which promote the formation of larger solder ball formations that cannot be evacuated by cleaning.

Grid 18, provided between IC chip 14 and substrate 12, forms a box around each chip joint site, creating a physical barrier between each of the C4s. In an embodiment, grid 18 may be made of an organic material. The presence of grid 18 prevents solder from individual C4s 16 from coming into contact with solder from other C4s 16 during the chip join process. This in turn prevents the formation of micro solder balls.

In one embodiment, the edge 20 of grid 18 that is adjacent to substrate 12, includes a thermally activated adhesive. The thermally activated adhesive may include a thermally activated epoxy in an embodiment. This thermally activated adhesive adheres edge 20 of grid 18 to substrate 12. Grid 18 is placed on substrate 12, and IC chip 14 is placed on grid 18. In various embodiments, grid 18 may be placed on substrate 12 prior to the placement of IC chip 14 on grid 18, or may be placed on chip 14 prior to the placement of chip 14 on substrate 12. The presence of the adhesive on edge 20 of grid 18 further serves to adhere substrate 12 to chip 14. This eliminates the need for an underfill, and associated inspection thereof.

Figure 3:
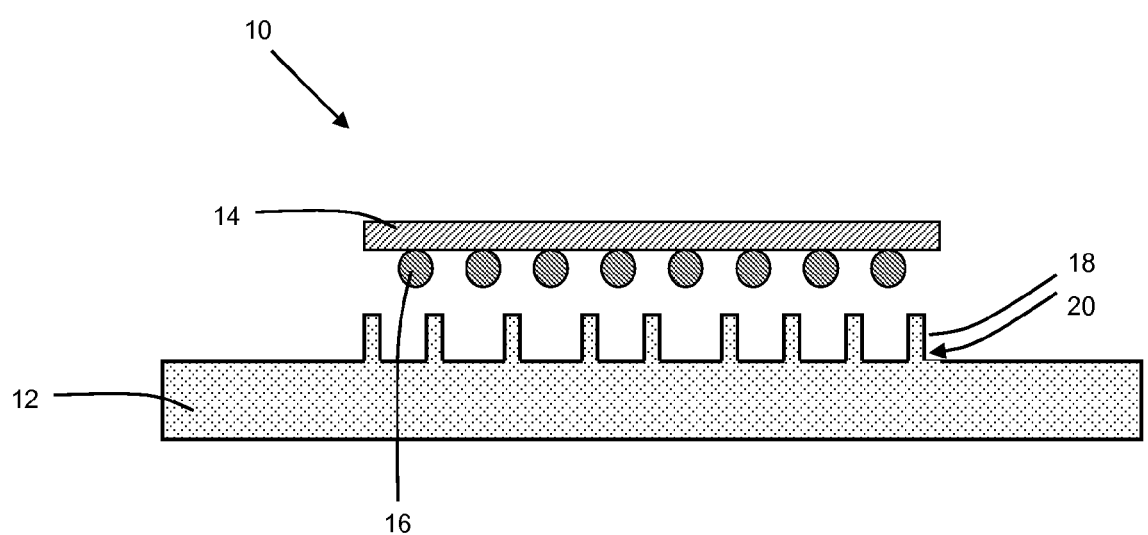
FIG. 3 shows an alternate embodiment of a structure according to the disclosure.

Turning now to FIG. 3, an alternative embodiment is depicted, in which grid 18 may be incorporated into the fabrication of substrate 12, rather than provided separately.

Figure 4:
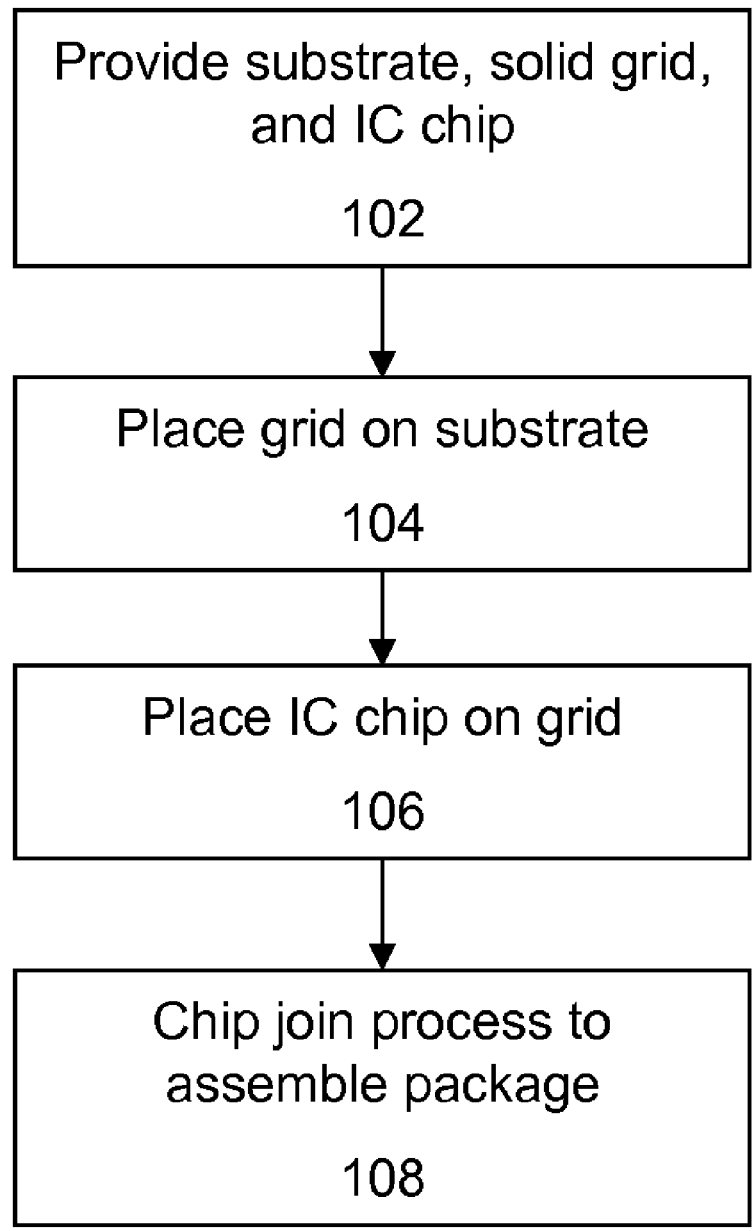
FIG. 4 shows a method according to the disclosure.

Referring now to FIG. 4, a method of making the IC chip package depicted in FIGS. 1-2 is shown. In a first step 102, a substrate 12, a solid grid 18, and an IC chip 14 are provided. IC chip 14 includes C4s 16.

In step 104, grid 18 is placed on the substrate. Grid 18 includes an edge 20 that is placed adjacent to substrate 12. In one embodiment, edge 20 includes a thermally activated adhesive, which, in a further embodiment, is a thermally activated epoxy. The thermally activated adhesive adheres edge 20 of grid 18 to substrate 12.

In step 106, IC chip 14 is placed on grid 18. It is noted that step 106 may be performed prior to step 104 in another embodiment. In further alternate embodiments, grid 18 may be placed on substrate 12 prior to the placement of IC chip 14 on grid 18, or may be placed on chip 14 prior to the placement of chip 14 on substrate 12.

After placement according to steps 104 and 106, grid 18 forms a box around each chip join site, creating a physical barrier between each C4 16. In step 108, a chip join process is used to assemble IC chip package 10. The presence of grid 18 prevents bridging between C4s 16 and reduced spacing between C4 joints during step 108, thus preventing the formation of solder balls.

In an alternative embodiment, a substrate 12 may be provided in step 102, wherein grid 18 is incorporated into the substrate, thus obviating the need for placing grid 18 on substrate 12 in step 104, and adhering the same.

The methods and structures as described above are used in the fabrication of integrated circuit chip packages. After fabrication, the chip is typically mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing drawings show some of the processing associated according to several embodiments of this disclosure. In this regard, each drawing or block within a flow diagram of the drawings represents a process associated with embodiments of the method described. It should also be noted that in some alternative implementations, the acts noted in the drawings or blocks may occur out of the order noted in the figure or, for example, may in fact be executed substantially concurrently or in the reverse order, depending upon the act involved. Also, one of ordinary skill in the art will recognize that additional blocks that describe the processing may be added.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) chip package comprising:
   a substrate;
   an IC chip including a plurality of controlled collapse chip connections (C4s); and
   a solid grid comprising a first material, wherein the grid forms a box around each of the plurality of C4s and creates a physical barrier between each of the plurality of C4s, the grid being located between the substrate and the IC chip,
   wherein an edge of the grid adjacent to the substrate includes a thermally activated adhesive, the adhesive comprising a second material, and the adhesive adheres the grid to the substrate.

2. The IC chip package of claim 1, wherein the first material further comprises an organic material.

3. The IC chip package of claim 1, wherein the thermally activated adhesive is a thermally activated epoxy.

4. The IC chip package of claim 1, wherein the thermally activated adhesive further adheres the substrate to the IC chip.

* * * * *